United States Patent
Chen et al.

(10) Patent No.: US 12,302,658 B2
(45) Date of Patent: May 13, 2025

(54) SEMICONDUCTOR IMAGE-SENSING STRUCTURE

(71) Applicant: TAIWAN SEMICONDUCTOR MANUFACTURING COMPANY LTD., Hsinchu (TW)

(72) Inventors: Wei-Lin Chen, Tainan (TW); Yu-Cheng Tsai, Tainan (TW); Chun-Hao Chou, Tainan (TW); Kuo-Cheng Lee, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 369 days.

(21) Appl. No.: 17/813,947

(22) Filed: Jul. 21, 2022

(65) Prior Publication Data

US 2024/0030256 A1    Jan. 25, 2024

(51) Int. Cl.
*H10F 39/18* (2025.01)
*H10F 39/00* (2025.01)
*H10F 39/12* (2025.01)

(52) U.S. Cl.
CPC ....... *H10F 39/8067* (2025.01); *H10F 39/184* (2025.01); *H10F 39/199* (2025.01); *H10F 39/80373* (2025.01)

(58) Field of Classification Search
CPC ......... H01L 27/14614; H01L 27/14629; H01L 27/1464; H01L 27/14649
See application file for complete search history.

(56) References Cited

U.S. PATENT DOCUMENTS

| | | | | |
|---|---|---|---|---|
| 2008/0290441 A1* | 11/2008 | Hsu | ...................... | H01L 27/1464 257/460 |
| 2011/0254115 A1* | 10/2011 | Shih | ..................... | H01L 27/1464 257/E31.127 |
| 2021/0183935 A1* | 6/2021 | Chen | ................. | H01L 27/14625 |

* cited by examiner

*Primary Examiner* — Kevin K Pyo
(74) *Attorney, Agent, or Firm* — WPAT LAW; Anthony King

(57) ABSTRACT

A semiconductor image sensing structure includes a semiconductor substrate having a front side and a back side, a pixel sensor disposed in the semiconductor substrate, a transistor disposed over the front side of the semiconductor substrate, and a reflective structure disposed over the front side of the semiconductor substrate. A gate structure of the transistor and the reflective structure include a same material. A top surface of the gate structure of the transistor and a top surface of the reflective structure are aligned with each other.

20 Claims, 4 Drawing Sheets

SEMICONDUCTOR IMAGE-SENSING STRUCTURE

BACKGROUND

Semiconductor image sensors are used to sense radiation, such as light. Complementary metal-oxide-semiconductor (CMOS) image sensors (CIS) are widely used in various applications, such as digital cameras and mobile phone cameras. Such cameras utilize an array of pixels located in a semiconductor substrate, including photodiodes and transistors that can absorb radiation projected toward the semiconductor substrate and convert the sensed radiation into electrical signals.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

DETAILED DESCRIPTION OF THE DISCLOSURE

Figures 1, 2:
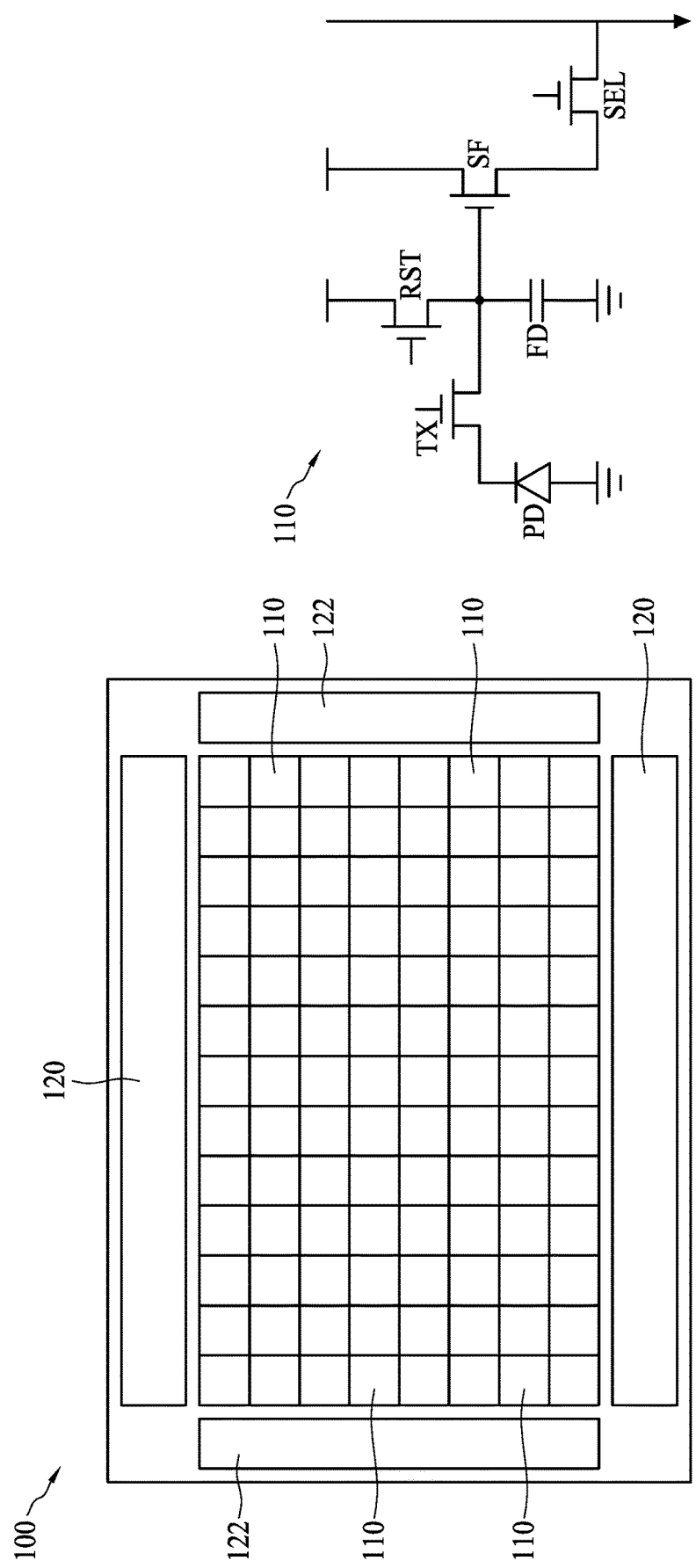
FIG. 1 shows a CMOS image sensor (CIS) architecture in accordance with some embodiments of the present disclosure.
FIG. 2 is a schematic view of a semiconductor image-sensing structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Backside illumination (BSI) image sensors are replacing front-side illumination sensors for their greater efficiency in capturing photons. During formation of the BSI image sensors, the BSI image sensors and logic circuits are formed in a semiconductor substrate of a wafer (or silicon chip), followed by formation of a back-end-of-line (BEOL) interconnect structure over a front side of the semiconductor substrate, and an optical stack including color filters and micro-lenses corresponding to the image sensors disposed over a back side of the semiconductor substrate.

It is found that light having large wavelengths, e.g., wavelengths greater than 610 nanometers, may pass through the BSI image sensors, the semiconductor substrate, and even the BEOL, interconnect structure. The large-wavelength light may be absorbed by dielectric layers of the BEOL interconnect structure, where the BEOL metallization layers are located. The large-wavelength light may be transmitted to a carrier wafer or an application specific integrated circuit (ASIC) wafer. Light not absorbed by the image sensors is lost.

The present disclosure therefore provides a semiconductor image-sensing structure having a reflective structure formed by front-end-of-line (FEOL) manufacturing operations. The reflective structure helps reflect light back into image sensors and reduces light entering a BEOL interconnect structure. Accordingly, light quantum efficiency (QE) of large-wavelength light is improved.

Referring to FIG. 1, an image sensor device 100 is provided. The image sensor device 100 may include an array of semiconductor image-sensing structures 110 (e.g., pixels). In some embodiments, the image sensor device 100 may be a CIS or active pixel sensor. In some embodiments, the image sensor device 100 may be a charge coupled device (CCD) or passive pixel sensor. In some embodiments, the image sensor device 100 is a back-side illuminated (BSI) sensor device. The image sensor device 100 includes a plurality of the semiconductor image-sensing structures 110 arranged in the array for measuring an intensity or a brightness of radiation. In some embodiments, each of the semiconductor image-sensing structures 110 may include at least one photo-sensing element, such as a photodiode. In other embodiments, the semiconductor image-sensing structures 110 may include pinned photodiodes. In some embodiments, photogate detectors, phototransistors, and/or other detectors known in the art may be used as the semiconductor image-sensing structures 110. It should be understood that the image sensor device 100 may include many hundreds or thousands of semiconductor image-sensing structures 110 in a sensor array area. In some embodiments, readout circuits 120 and pixel control circuits (i.e., logic drive circuits) 122 may be disposed at sides of the array of the semiconductor image-sensing structures 110, as shown in FIG. 1, but the disclosure is not limited thereto. For simplicity, a single semiconductor image-sensing structure 110 is described in the present disclosure; however, typically an array of such semiconductor image-sensing structures 110 may form the image sensor device 100, as illustrated in FIG. 1.

Referring to FIG. 2, in some embodiments, the semiconductor image-sensing structure 110 may include a reset transistor (RST), a source follower transistor (SF), a row selector transistor (SEL or RSL) and a transfer transistor (Tx). In such embodiments, the semiconductor image-sensing structure 110 is referred to as a four-transistor structure, or a 4 T structure. However, various other configurations are possible, including, for example, a 3 T structure or a 5 T structure. Additional circuitry and input/outputs such as the readout circuits 120 and the pixel control circuits 122 are typically provided adjacent to the array of semiconductor image-sensing structures 110 for providing an operation environment for the semiconductor image-sensing structures 110 and for supporting external communications with the semiconductor image-sensing structures 110.

Still referring to FIG. 2, the semiconductor image-sensing structure 110 further includes a photo-sensing element (i.e., photodiode) PD. The photo-sensing element PD is electrically connected in series to the transfer transistor Tx. The transfer transistor Tx is electrically connected in series to the reset transistor RST. A gate structure of the source follower transistor SF is electrically connected to a source region of the reset transistor RST, and a drain region of the source follower transistor SF is electrically connected to a power supply. The row selector transistor RSL is electrically connected in series to the source follower transistor SF. The reset transistor RST may function to reset the semiconductor image-sensing structure 110, e.g., by resetting a floating diffusion region (or a floating node FD), described below. The source follower transistor SF may allow a voltage of the semiconductor image-sensing structure 110 to be observed without removing an accumulated charge. The row selector transistor RSL may be a row-select transistor and may allow a single row of the image-sensing elements in an array, such as the array of FIG. 1, to be read when the row selector transistor RSL is turned on. The drain of the transfer transistor Tx includes a floating diffusion region FD, described below. The transfer transistor Tx can move signal charges accumulated in the photo-sensing element PD to the floating diffusion region FD. For example, a transfer gate structure (or a gate structure of the transfer transistor Tx) controls a transfer of electrons between the photo-sensing element PD and the floating diffusion region FD. Because the floating diffusion region FD is coupled to the gate structure of the source follower transistor SF, if the row selector transistor RSL is turned on (i.e., if the row is selected), then data is output from the semiconductor image-sensing structure 110.

Figure 4:
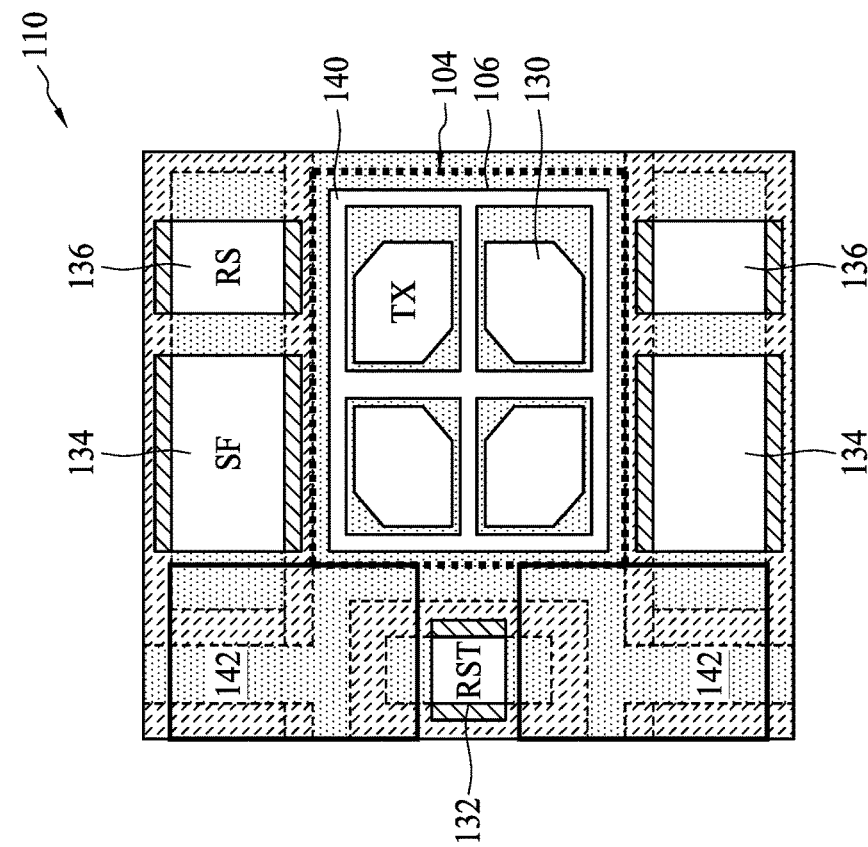
FIG. 4 shows a plan view of a semiconductor image-sensing structure accordance with some embodiments of the present disclosure.
Figure 3:
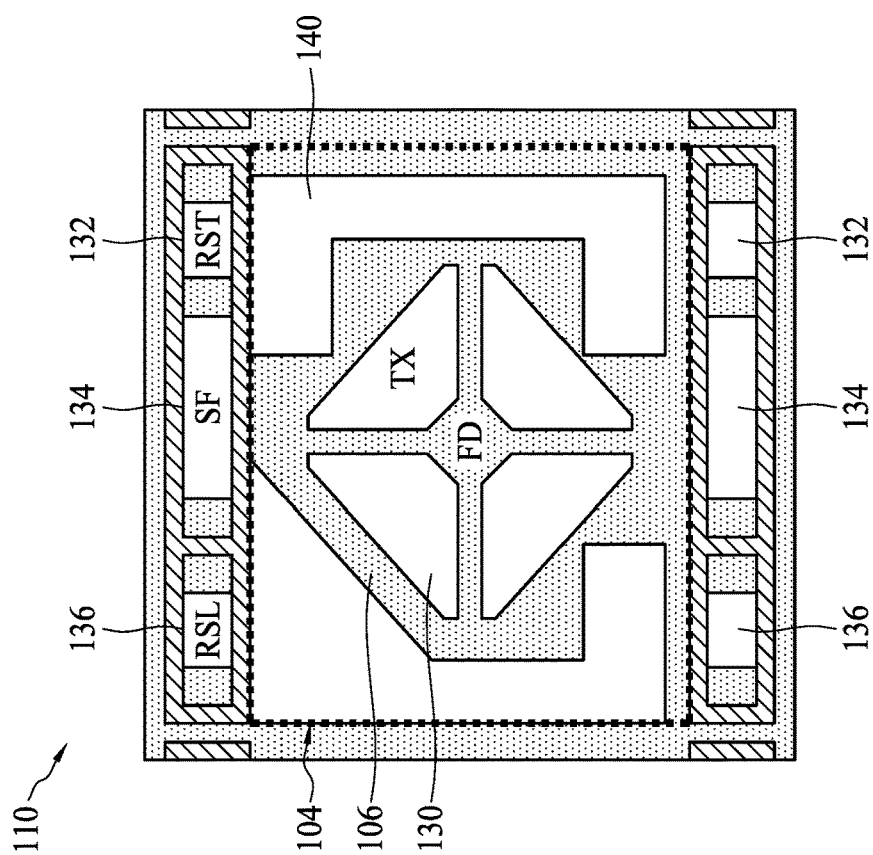
FIG. 3 shows a plan view of a semiconductor image-sensing structure in accordance with some embodiments of the present disclosure.

Please refer to FIGS. 3 and 4, wherein each of FIGS. 3 and 4 is a plan view of a semiconductor image-sensing structure 110 in accordance with various embodiments of the present disclosure. It should be noted that same elements in FIGS. 3 and 4 are depicted by same numerals and may have similar materials; therefore, repeated description is omitted. Each of the semiconductor image-sensing structures 110 includes a semiconductor substrate 102 (shown in FIGS. 5 and 6). Further, each of the semiconductor image-sensing structures 110 includes a sensing region 104 defined in the semiconductor substrate 102. Referring to FIGS. 3 and 4, in some embodiments, each of the semiconductor image-sensing structures 110 includes a gate structure 130 disposed over the sensing region 104. In some embodiments, the gate structure 130 covers portions of the sensing region 104. In some embodiments, the gate structure 130 may be a gate structure of the transfer transistor Tx, but the disclosure is not limited thereto. In some embodiments, the semiconductor image-sensing structure 110 may include other gate structures such as gate structures 132 of the reset transistors RST, gate structures 134 of the source follower transistors SF, and gate structures 136 of the row selector transistors RSL. In such embodiments, the gate structures 132, 134 and 136 are all disposed in a position offset from the sensing region 104, as shown in FIGS. 3 and 4. It should be understood that each of the transistors has other elements such as a source region, a drain region, etc.; however, such elements are omitted from FIGS. 3 and 4 for brevity.

Additionally, arrangements of the abovementioned transistors can be modified according to various product designs.

Still referring to FIGS. 3 and 4, in some embodiments, each of the semiconductor image-sensing structures 110 further includes a reflective structure 140. The reflective structure 140 is disposed over the sensing region 104. Further, the reflective structure 140 is separated from the gate structures 130 of the transfer transistors Tx. A ratio of an area of the reflective structure 140 to an area of the sensing region 104 is between approximately 65% and approximately 80%, but the disclosure is not limited thereto. In some embodiments, a ratio of an area of the gate structure 130 to the area of the sensing region 104 is between approximately 20% and approximately 35%, but the disclosure is not limited thereto.

In some embodiments, the reflective structure 140 may have a continuous configuration, as shown in FIG. 4. In other embodiments, the reflective structure 140 may have a configuration of islands that are separated from each other, as shown in FIG. 3. It should be noted that shapes, configurations, and locations of the reflective structure 140 are very flexible, and can be modified according to different product designs.

Referring to FIG. 4, in some embodiments, the semiconductor image-sensing structure 110 may further include another reflective structure 142. The reflective structure 142 includes a material same as a material of the reflective structure 140. The reflective structure 142 may be formed by operations same as those for forming the reflective structure 140. The reflective structure 142 is disposed beyond the sensing region 104. Further, the reflective structure 142 is separated from all of the gate structures 130, 132, 134 and 136. In some embodiments, the reflective structure 142 is separated from the reflective structure 140, as shown in FIG. 4, but the disclosure is not limited thereto. In some embodiments, the reflective structures 140 and 142 are coupled. It should be noted that a shape, a configuration and an arrangement of the reflective structure 142 can be modified depending on various product designs for improved light reflection.

In some embodiments, the reflective structures 140 and 142, and the gate structures 130, 132, 134 and 136 may include a same material formed by same operations. For example, all of the gate structures 130, 132, 134 and 136 and the reflective structures 140 and 142 include a same semiconductor material, such as polysilicon, but the disclosure is not limited thereto. In other embodiments, all of the gate structures 130, 132, 134 and 136, and the reflective structures 140 and 142 include same metal materials. In still other embodiments, the reflective structures 140 and 142 include materials different from those of the gate structures 130, 132, 134 and 136. For example but not limited thereto, all the gate structure 130, 132, 134 and 136 include metal materials, while the reflective structures 140 and 142 include a semiconductor material such as polysilicon. Alternatively, all the gate structure 130, 132, 134 and 136 include a same semiconductor material, while the reflective structures 140 and 142 include metal materials.

Figure 5:
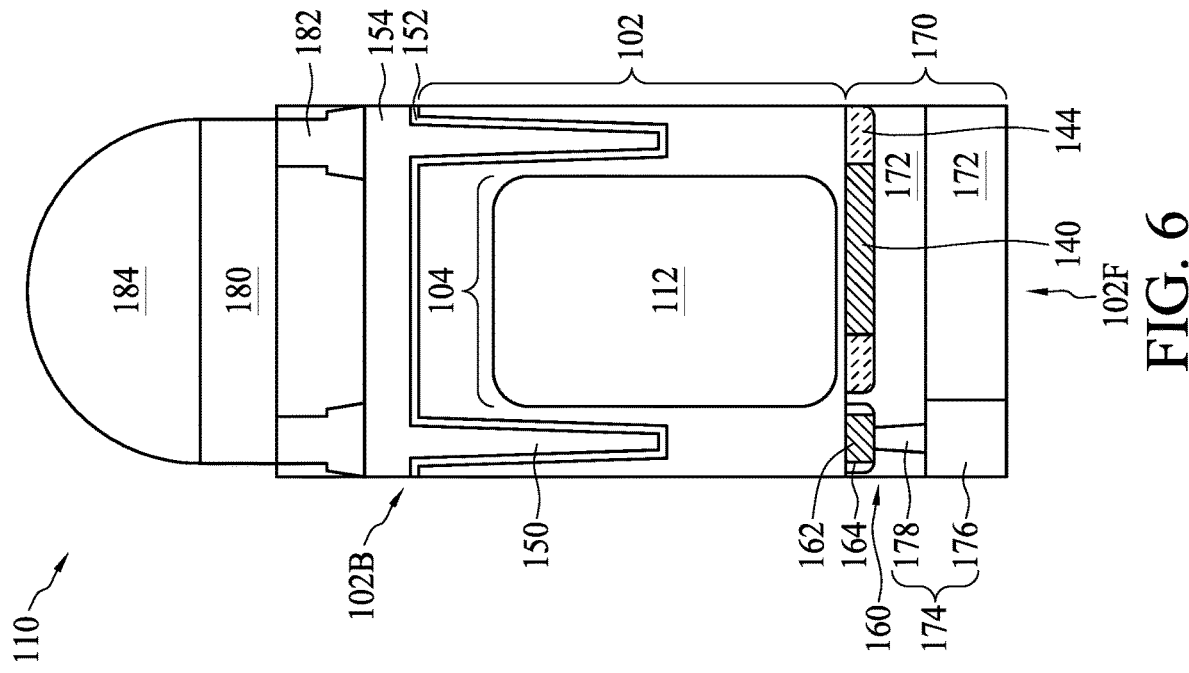
FIG. 5 is a cross-sectional view of a semiconductor image-sensing structure in accordance with some embodiments of the present disclosure.
Figure 6:
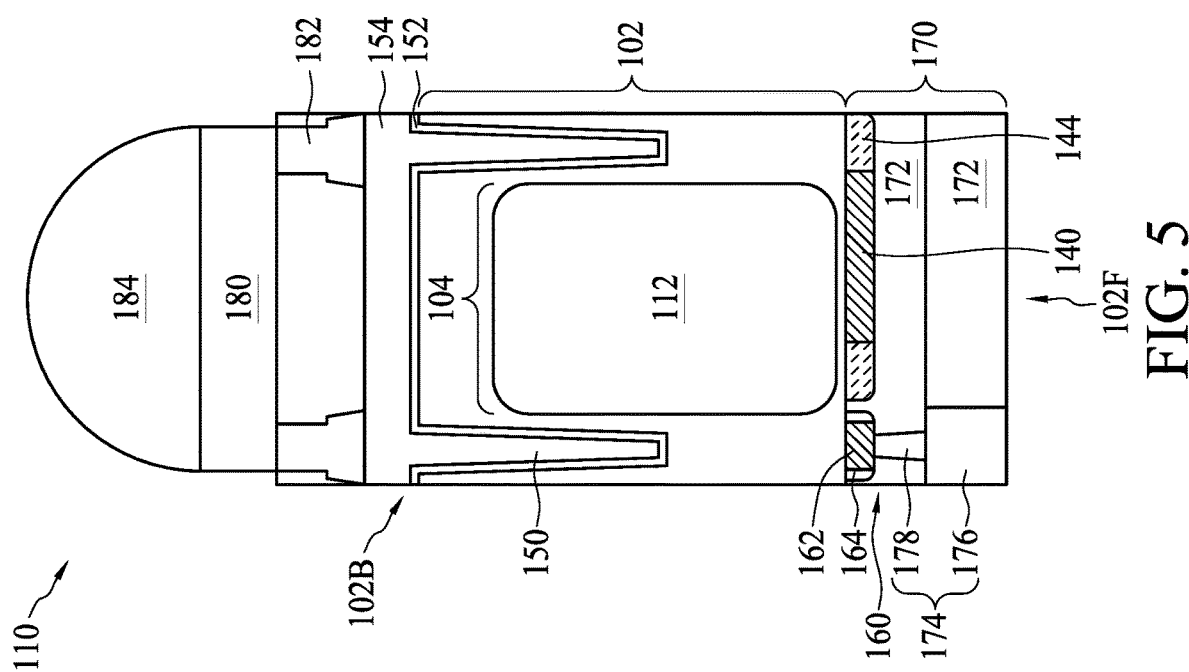
FIG. 6 is a cross-sectional view of a semiconductor image-sensing structure in accordance with some embodiments of the present disclosure.

Please referring to FIGS. 5 and 6, which are cross-sectional views of a semiconductor image-sensing structure 100 in accordance with various embodiments of the disclosure. It should be noted that a plan view of the semiconductor image-sensing structures shown in FIGS. 5 and 6 may be similar to those shown in FIGS. 3 and 4, but the disclosure is not limited thereto. Further, same elements shown in FIGS. 3 to 6 may designated by same numerals, and details, such as materials, of same elements shown in FIGS. 3 to 6 are omitted for brevity.

As shown in FIGS. 5 and 6, the semiconductor image-sensing structure 110 includes a semiconductor substrate 102. The semiconductor substrate 102 has a front side 102F and a back side 102B opposite to the front side 102F. In some embodiments, the semiconductor substrate 102 may be formed of a semiconductor material such as silicon, germanium, diamond or like materials. Compound materials used for semiconductor substrates such as silicon germanium, silicon carbide, gallium arsenide, indium arsenide, indium phosphide, or combinations of these may be used. In alternative embodiments, the semiconductor substrate 102 may include a silicon on insulator (SOI) semiconductor substrate.

The semiconductor image-sensing structure 110 may include a photo-sensing element 112 such as a photodiode 112 configured to convert light signals (photons) to electrical signals. The photo-sensing element 112 is disposed to receive light with a predetermined wavelength. In some embodiments, the photo-sensing element 112 is operated to sense visible light of incident light. In other embodiments, the photo-sensing element 112 is operated to sense infrared OR) and/or near-infrared (NIR) of the incident light.

The semiconductor image-sensing structure 110 may include an isolation structure, such as a deep-trench isolation (DTI) structure 150, surrounding and between the photo-sensing elements 112 as shown in FIGS. 5 and 6. In some embodiments, the isolation structure 150 may extend from the back side 102B into the semiconductor substrate 102. Further, the isolation structures 150 separate the photo-sensing elements 112 from each other. In some embodiments, a depth of the isolation structure 150 may be equal to a thickness of the semiconductor substrate 102, but the disclosure is not limited thereto. For example, the depth of the isolation structure 150 may be less than the thickness of the semiconductor substrate 102, as shown in FIGS. 5 and 6, but the disclosure is not limited thereto. The isolation structure 150 provides optical isolation between neighboring photo-sensing elements 112, thereby serving as a semiconductor substrate isolation grid and reducing cross-talk.

In some embodiments, logic devices, such as a transistor 160, can be disposed over the front side 102F of the semiconductor substrate 102. The transistor 160 may be configured to enable readout of the photo-sensing element 112. In some embodiments, the transistor 160 is the transfer transistor. The transfer transistor includes a gate structure 162 and a source/drain region (not shown). The source/drain regions may refer to a source or a drain, individually or collectively, depending on context. The transistor 160 may further include other elements such as spacers, and/or stressors of the source/region regions, and the gate structure 162 may further include elements such as a gate dielectric layer and a gate conductive layer. Descriptions of such details are omitted for brevity.

The semiconductor image-sensing structure 110 further includes a back-end-of-line (BEOL) interconnect structure 170 disposed over the front side 102F of the semiconductor substrate 102. The BEOL interconnect structure 170 (i.e., BEOL metallization layers 174) is electrically connected to the semiconductor image-sensing structure 110. For example, the BEOL interconnect structure 170 electrically connects the transistor 160 to other circuits, as shown in FIGS. 5 and 6. Further, the BEOL interconnect structure 170 electrically connects the semiconductor image-sensing structure 110 to other structures, devices or circuits. In some embodiments, the BEOL interconnect structure 170 includes a plurality of dielectric layers 172, and a plurality of metallization layers 174 and via conductors 176 disposed in the dielectric layers 172.

In some embodiments, the semiconductor image-sensing structure 110 includes a reflective structure 140 disposed over the front side 102F of the semiconductor substrate 102. In some embodiments, the reflective structure 140 may further includes a gate dielectric layer and a gate conductive layer, though not shown. In some embodiments, the reflective structure 140 further includes a spacer 144 over sidewalk of itself, as shown in FIGS. 5 and 6. As mentioned above, the transistor 160 (i.e., the gate structure 162) is electrically connected to the BEOL interconnect structure 170, but transistor 160 (i.e., the gate structure 162, the spacer 164 and the source/drain regions) is separated from the reflective structure 140. Further, the reflective structure 140 is separated from the BEOL metallization layers 174 of the BEOL interconnect structure 170. In some embodiments, the reflective structure 140 is separated from other elements. In such embodiments, the reflective structure 140 is electrically isolated or electrically floating over the front side 102F of the semiconductor substrate 102 and embedded in the dielectric layer 172.

Referring to FIG. 5, in some embodiments, the gate structure 162 of the transistor 160 and the reflective structure 140 are formed by same operations; therefore, the gate structure 162 and the reflective structure 140 include one or more same materials. For example, the gate structure 162 and the reflective structure 140 may both include a semiconductor material layer, such as a polysilicon layer. Further, the gate structure 162 and the reflective structure 140 may both further include a gate dielectric layer between the semiconductor substrate 102 and the semiconductor material layer. When the gate structure 162 and the reflective structure 140 are formed by the same operation, a dielectric layer (not shown) is formed over the front side 102F of the semiconductor substrate 102, and a semiconductor material layer (i.e., a doped or undoped polysilicon layer) is sequentially formed over the dielectric layer. A patterning operation using a pattered photoresist and a patterned hard mask is then performed on the semiconductor material layer and the dielectric layer, thereby simultaneously forming the gate structure 162 and the reflective structure 140 over the front side 102F of the semiconductor substrate 102.

It should be noted that a top surface of the gate structure 162 and a top surface of the reflective structure 140 are aligned with each other. In such embodiments, a top surface of the semiconductor layer of the gate structure 162 and a top surface of the semiconductor layer of the reflective structure 140 are aligned with each other. In some embodiments, a bottom surface of the gate structure 162 and a bottom surface of the reflective structure 140 are aligned with each other. In such embodiments, a bottom surface of the gate dielectric layer of the gate structure 162 and a bottom surface of the gate dielectric layer of the reflective structure 140 are aligned with each other. In some embodiments, a height of the gate structure 162 and a height of the reflective structure 140 are the same. However, a dimension of the reflective structure 140 is greater than a dimension of the gate structure 162 of the transistor 160. Further, at least a portion of the reflective structure 140 overlaps the photo-sensing element 112.

In some embodiments, spacers 164 and 144 are subsequently formed on sidewalk of the gate structure 162 and the reflective structure 140. In some embodiments, the spacers 164 and 144 are made of silicon nitride (SiN), silicon carbide (SiC), SiO, silicon oxynitride (SiON), silicon carbon or another suitable material, but the disclosure is not limited thereto. In some embodiments, the spacers 164 and 144 are formed by deposition and etching back operations.

In some embodiments, source/drain regions (not shown) are formed at opposite sides of the gate structure 162. In such embodiments, the source/drain regions may be formed by forming recesses in the semiconductor substrate 102 and growing a strained material in the recesses by an epitaxial (epi) process. In addition, a lattice constant of the strained material may be different from a lattice constant of the semiconductor substrate 102. Accordingly, the source/drain regions may have stressors that improve carrier mobility. In some embodiments, Ge, SiGe, InAs, InGaAs, InSb, GaSb, InAlP, InP, SiP, or a combination thereof, can be used to form the source/drain regions, depending on whether the FET device is a p-type FET device or an n-type FET device. For example, SiGe may be used to form the source/drain regions of the PFET device, while SiP is used to form the source/drain regions of the NFET device.

Still referring to FIG. 5, in some embodiments, the gate structure 162 and the reflective structure 140 include a same metal material. In such embodiments, the gate structure 162 and the reflective structure 140 may undergo a replacement polysilicon gate (RPG) operation. Accordingly, a dielectric layer and a semiconductor material layer may be sequentially formed over the front side 102F of the semiconductor substrate 102, followed by the above mentioned patterning operation. Thus, a sacrificial gate structure and a temporary reflective structure are formed over the front side 102E of the semiconductor substrate 102. Other elements, such as spacers, source/drain regions, an etch stop layer such as contact etch stop layer (CESL), and an inter-layer dielectric (ILD) layer are formed over the front side 102E of the semiconductor substrate 102. Thereafter, the sacrificial gate structure and the temporary reflective structure are replaced with metal materials. Accordingly, the gate structure 162 and the reflective structure 140 may include a high-k gate dielectric, layer, at least a work function metal layer (e.g., a titanium aluminum (TiAl) layer or a tantalum aluminum (TaAl) layer), a gap-filling metal layer (e.g., an aluminum (Al) layer), and other layers such as a barrier layer and/or an etch stop layer are formed.

In some embodiments, the formation of the gate structure 162 and the reflective structure 140 may be integrated with RPG approaches. Thus, process integration is improved.

In some embodiments, the gate structure 162 of the transistor 160 and the reflective structure 140 may include different materials. For example, the gate structure 162 includes a semiconductor material, and the reflective structure 140 includes metal materials. In such embodiments, RPG operations may be performed to replace the temporary reflective structure (including semiconductor material) with metal material, while the gate structure 162 of the transistor 160 is protected from the RPG operations.

In some embodiments, the RPG operations are performed to replace the sacrificial gate structure with metal materials, while the reflective structure 140 is protected from the RPG operations. In such embodiments, the gate structure 162 of the transistor 160 includes metal material, and the reflective structure 140 includes semiconductor material.

The semiconductor image-sensing structure 110 further includes an anti-reflective coating (ARC) 152 and a dielectric layer 154 disposed over the back side 102B of the semiconductor substrate 102, as shown in FIGS. 5 and 6. In some embodiments, the ARC 152 may extend into the semiconductor substrate 102 and covers sidewalls and bottoms of the isolation structure 150. In some embodiments, the dielectric layer 154 is coupled to the isolation structure 150. In some embodiments, the dielectric layer 154 can include, for example, an oxide such as silicon dioxide, but the disclosure is not limited thereto. In some embodiments, the dielectric layer 154 provide a flat and even surface over the back side 102B of the semiconductor substrate 102.

The semiconductor image-sensing structure 110 further includes a color filter 180 disposed over the semiconductor substrate 102 on the hack side 102B. Further, the color filter 180 is aligned with the photo-sensing element 112, as shown in FIGS. 5 and 6. In some embodiments, a low-n grid 182 may be disposed between the color filter 180 and the back side 102B of the semiconductor substrate 102. The color filter 180 may have a refractive index that is less than a refractive index of the low-n grid 182. It will be appreciated that due to the different refractive indices of the color filter 180 and the low-n grid 182, when light, such as photons, encounter an interface between the color filter 180 and the low-n grid 182, the light is reflected away from the low-n grid 182 and back into the color filter 180 or into the semiconductor substrate 102, such that the light is not directed toward an incorrect neighboring photodiode.

The color filter 180 allows different specific colors or wavelengths of light to through. For example, the color filter 180 may allow red light, or wavelengths corresponding to red light, to pass through, while allowing substantially no other colors of light to therethrough. The color filter 180 may allow blue light, or wavelengths corresponding to blue light, to pass through, while allowing substantially no other colors of light to pass through. Alternatively, the color filter 180 may allow green light, or wavelengths corresponding to green light, to pass through, while allowing substantially no other colors of light to pass through. In some embodiments, other colors of light may be allowed to exclusively pass through the color filter 180, but the disclosure is not limited thereto.

The semiconductor image-sensing structure 110 further includes a micro-lens 184 disposed over the color filter 180. The micro-lens 184 is configured to focus light toward the photo-sensing element 112.

According to the semiconductor image-sensing structure 110 provided by the present disclosure, the reflective structure 140 is formed by FEOL operations. The reflective structure 140 helps to reflect light before it enters the BEOL interconnect structure 170; therefore, light quantum efficiency (QE) of the semiconductor image-sensing structure 110 is improved. In some embodiments, QE for the light of greater wavelengths is further improved by the reflective structure 140.

In some comparative approaches that provide a reflective structure in the BEOL interconnect structure 170, such approaches suffer from complicated designs for BEOL wire routing. In contrast with the comparative approaches, the reflective structure 140 of the present disclosure is separated from the BEOL metallization layers 174 by the dielectric layer 172 of the BEOL interconnect 170; thus, design of wire routing of the BEOL metallization layers 174 is simplified, which is beneficial for all aspects of design and fabrication.

Figure 7:
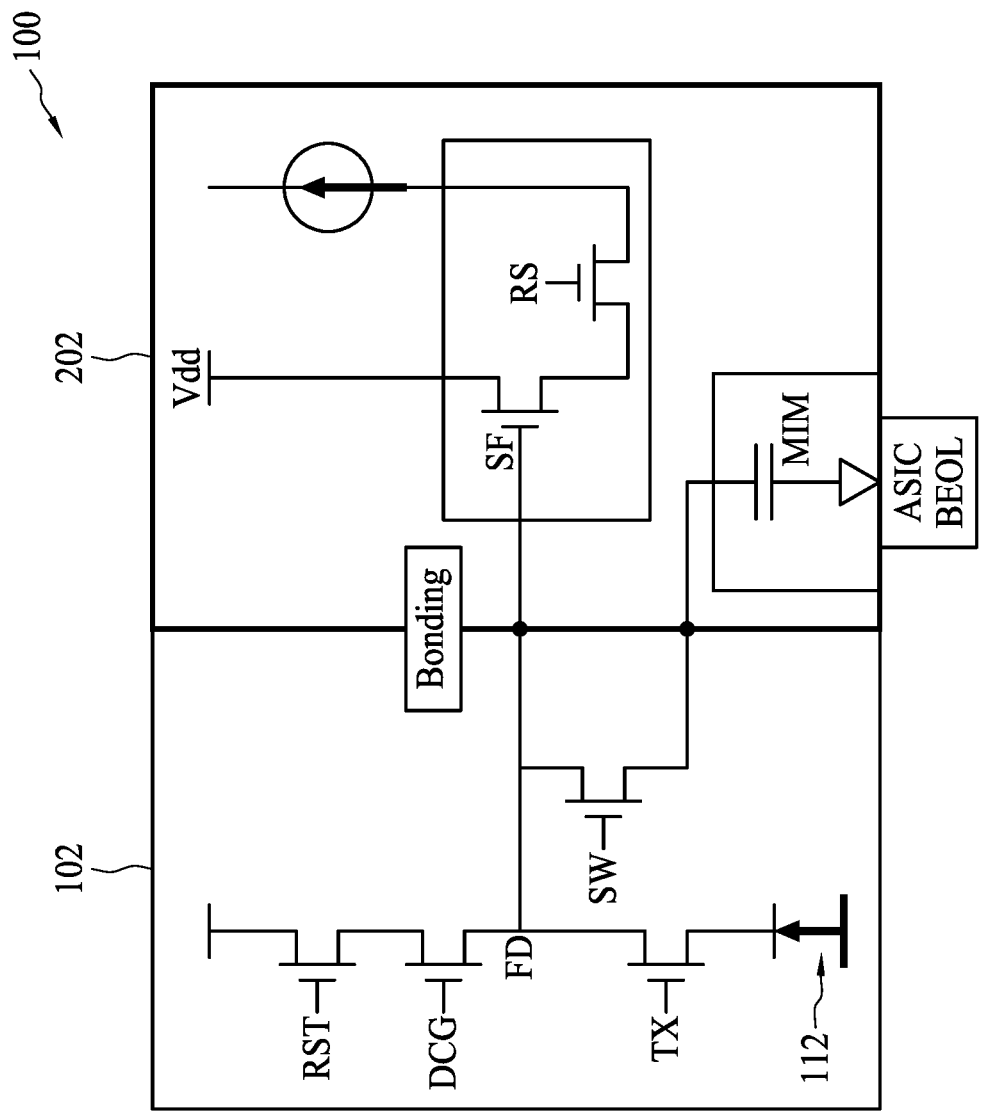
FIG. 7 is a schematic view of a semiconductor image-sensing structure in accordance with some embodiments of the present disclosure.

Please referring to FIG. 7, which is a schematic view of a semiconductor image-sensing structure in accordance with some embodiments of the present disclosure. In some embodiments, when the semiconductor image-sensing structure 110 is integrated with a 3D stacking approach, some transistors may be located in another semiconductor substrate. For example, a source follower transistor SF and a row selector transistor RSL may be formed in another semiconductor substrate 202 or wafer, such as an application specific integrated circuit (ASIC) wafer. In such embodiments, spaces are in conserved and is thus available for disposing additional reflective structure 140, and thus QE may be further improved. The semiconductor substrate 202 accommodating the source follower transistor SF, the row selector transistor RSL and other devices can be bonded to the semiconductor substrate 102 accommodating the photo-sensing element 112, the reset transistor RST, the transfer transistor Tx, the reflective structure 142 and other devices to realize a 3D-stacking sensor device 100.

The present disclosure therefore provides a semiconductor image-sensing structure having a reflective structure formed by front-end-of-line (FEOL) manufacturing operations. The reflective structure helps reflect light back into image sensors before entering a BEOL metallization structure. Accordingly, light quantum efficiency (QE) is improved for longer wavelengths of light. In addition, because the reflective structure is formed by the FEOL operations, design and manufacturing of the BEOL metallization structure are simplified. Further, the forming of the reflective structure is integrated with the forming of a semiconductor gate structure or a metal gate structure; therefore, the reflective structure provides an advantage of various options for materials. Accordingly, process flexibility is improved.

In some embodiments, a semiconductor image-sensing structure is provided. The semiconductor image-sensing structure includes a semiconductor substrate having a front side and a back side, a pixel sensor disposed in the semiconductor substrate, a transistor disposed over the front side of the semiconductor substrate, and a reflective structure disposed over the front side of the semiconductor substrate. A gate structure of the transistor and the reflective structure include a same material. A top surface of the gate structure of the transistor and a top surface of the reflective structure are aligned with each other.

In some embodiments, a semiconductor image-sensing structure is provided. The semiconductor image-sensing structure includes a semiconductor substrate having a front side and a back side, a pixel sensor disposed in the semiconductor substrate, a transistor disposed over the front side of the semiconductor substrate, and a reflective structure disposed over the front side of the semiconductor substrate. A gate structure of the transistor and the reflective structure include different materials. A top surface of the gate structure of the transistor and a top surface of the reflective structure are aligned with each other.

In some embodiments, a semiconductor image-sensing structure is provided. The semiconductor image-sensing structure includes a semiconductor substrate having a sensing region, a gate structure disposed over the sensing region, and a reflective structure disposed over the sensing region. A ratio of an area of the reflective structure to an area of the sensing region is between approximately 65% and approximately 80%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor image-sensing structure, comprising:
   a semiconductor substrate having a front side and a back side;
   a pixel sensor disposed in the semiconductor substrate;
   a transistor disposed over the front side of the semiconductor substrate; and
   a reflective structure disposed over the front side of the semiconductor substrate,
   wherein a gate structure of the transistor and the reflective structure comprise a same material, and a top surface of the gate structure of the transistor and a top surface of the reflective structure are aligned with each other,
   wherein the reflective structure surrounds the gate structure of the transistor from a plan view on the front side of the semiconductor substrate.

2. The semiconductor image-sensing structure of claim 1, wherein the gate structure of the transistor and the reflective structure comprise a same semiconductor material.

3. The semiconductor image-sensing structure of claim 1, wherein the gate structure of the transistor and the reflective structure comprise a same metal material.

4. The semiconductor image-sensing structure of claim 1, wherein a bottom surface of the transistor and a bottoms surface of the reflective structure are aligned with each other.

5. The semiconductor image-sensing structure of claim 1, further comprising an interconnect structure disposed over the front side of the semiconductor substrate, wherein the interconnect structure is electrically connected to the transistor.

6. The semiconductor image-sensing structure of claim 5, wherein the interconnect structure is separated from the reflective structure.

7. The semiconductor image-sensing structure of claim 1, further comprising:
- a color filter disposed over the back side of the semiconductor substrate; and
- a micro-lens disposed over the color filter.

8. A semiconductor image-sensing structure, comprising:
- a semiconductor substrate having a front side and a back side;
- a pixel sensor disposed in the semiconductor substrate;
- a transistor disposed over the front side of the semiconductor substrate; and
- a reflective structure disposed over the front side of the semiconductor substrate,
- wherein a gate structure of the transistor and the reflective structure comprise different materials, and a top surface of the gate structure of the transistor and a top surface of the reflective structure are aligned with each other,
- wherein the reflective structure surrounds the gate structure of the transistor from a plan view on the front side of the semiconductor substrate.

9. The semiconductor image-sensing structure of claim 8, wherein the gate structure of the transistor comprises a semiconductor material, and the reflective structure comprises a metal material.

10. The semiconductor image-sensing structure of claim 8, wherein the gate structure of the transistor comprises a metal material, and the reflective structure comprises a semiconductor material.

11. The semiconductor image-sensing structure of claim 8, wherein a bottom of surface of the transistor and a bottoms surface of the reflective structure are aligned with each other.

12. The semiconductor image-sensing structure of claim 8, further comprising an interconnect structure disposed over the front side of the semiconductor substrate, wherein the interconnect structure is electrically connected to the transistor.

13. The semiconductor image-sensing structure of claim 12, wherein the interconnect structure is separated from the reflective structure.

14. The semiconductor image-sensing structure of claim 8, further comprising:
- a color filter disposed over the back side of the semiconductor substrate; and
- a micro-lens disposed over the color filter.

15. A semiconductor image-sensing structure, comprising:
- a semiconductor substrate having a sensing region;
- a first gate structure and a second gate structure disposed over the sensing region; and
- a reflective structure disposed over the sensing region,
- wherein a ratio of an area of the reflective structure to an area of the sensing region is between approximately 65% and approximately 80%,
- wherein the reflective structure surrounds the first gate structure and the second gate structure from a plan view.

16. The semiconductor image-sensing structure of claim 15, wherein the first gate structure, the second gate structure and the reflective structure comprise a same material.

17. The semiconductor image-sensing structure of claim 15, wherein the first gate structure, the second gate structure and the reflective structure comprise different materials.

18. The semiconductor image-sensing structure of claim 15, wherein the reflective structure is separated from the first gate structure and from the second gate structure from a plan view.

19. The semiconductor image-sensing structure of claim 15, wherein the first gate structure and the second gate structure are separated from each other.

20. The semiconductor image-sensing structure of claim 19, wherein the first gate structure and the second gate structure are separated from each other by the reflective structure.

* * * * *